Feb. 15, 1966 R. V. ANDERSON ETAL 3,235,750

STEERING CIRCUIT FOR COMPLEMENTARY TYPE TRANSISTOR SWITCH

Filed June 8, 1962

INVENTORS
ROBERT V. ANDERSON
NICHOLAS A. PENEBRE
BY
ATTORNEY

United States Patent Office 3,235,750

Patented Feb. 15, 1966

3,235,750

STEERING CIRCUIT FOR COMPLEMENTARY TYPE TRANSISTOR SWITCH

Robert V. Anderson, Brewster, and Nicholas A. Penebre, Chappaqua, N.Y., assignor to General Precision, Inc., a corporation of Delaware Filed June 8, 1962, Ser. No. 201,048
1 Claim. (Cl. 307—88.5)

This invention relates to two-position electronic switches and in particular to such switches adapted for operation to alternate positions by pulses applied at a single input terminal.

The object of this invention is to provide an electronic switch for controlling current through a load, the switch being so constructed that it will draw little or no current in its open position.

The switch comprises a plurality of transistors and diodes so arranged that the application of a single pulse of a selected polarity to an input terminal causes the switch to apply current to a load. The application of a second pulse of the same selected polarity to the same input terminal causes the switch to interrupt the load current.

One of the advantages of this circuit is that, in the no-load current condition, the switch draws very little current. In fact, if silicon transistors be employed the total current drawn by the entire switch circuit, including any leakage through the load resistance, may be made less than one microampere.

A further understanding of this invention may be secured from the detailed description and drawings, in which.

Figure 1:
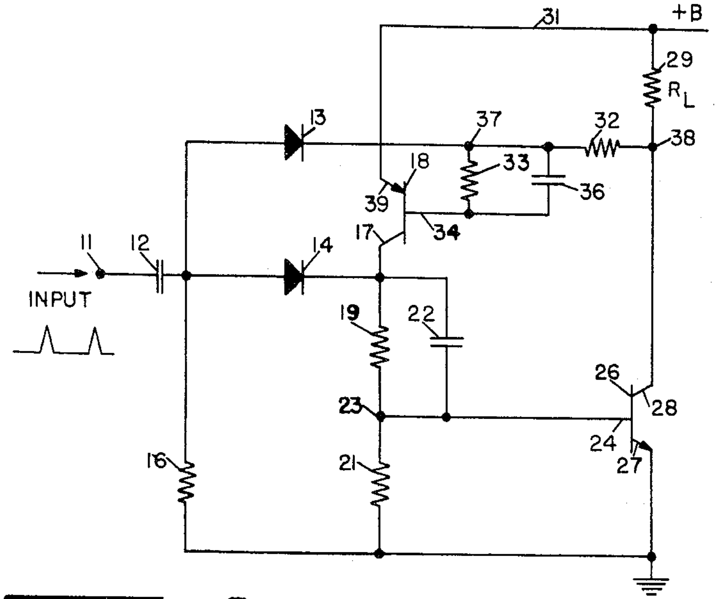
FIGURE 1 is an embodiment of the invention employing two transistors and two diodes.

Referring now to FIGURE 1, an input terminal 11 is coupled through a large capacitor 12 to the anodes of two diodes, 13 and 14, and through a resistor 16 to ground. The cathode of diode 14 is connected to the collector 17 of a PNP transistor 18 and also through two resistors, 19 and 21, to ground. Resistor 19 is by-passed by a large capacitor 22. The junction 23 of resistors 19 and 21 is connected to the base 24 of an NPN transistor 26 having its emitter 27 grounded. The collector 28 is connected to one end of a resistor 29 having its other end connected to a source of positive potential represented by the bus 31. The resistor 29 represents a load, the current through which is to be switched on and off by the electronic switch. The collector 28 is also connected through resistors 32 and 33 to the base 34 of transistor 18. The resistor 33 is by-passed by a large capacitor 36 and the junction 37 of the two resistors 32 and 33 is connected to the cathode of the diode 13. The emitter 39 of transistor 18 is connected to the positive bus 31.

In the operation of the circuit of FIGURE 1, let the switch be in the no-load current condition. Since no current flows in the load resistor 29, the potential at the resistor terminal 38 will be that of the positive bus 31. This potential will therefore be applied to the base 34 of the transistor 18 and, being the same as that of its emitter 39, no collector-emitter current will flow. Therefore no current will flow through the load resistors 19 and

21 of this transistor and their junction 23 is placed at ground potential. Since this is also the potential of the emitter 27 of transistor 26, there is no tendency for the flow of collector-emitter current through this transistor. The anodes of the diodes 13 and 14 are a ground potential, as is the cathode of diode 14. The cathode of diode 13, however, is at the positive bus potential, thus back-biasing this diode by the amount of the positive bus potential.

When a positive pulse is applied to the input terminal 11 this pulse is coupled by capacitor 12 to both diode anodes. However, diode 13, being back-biased, does not become conductive when the pulse is of less amplitude than the positive bus potential. The diode 14, however, tends to become conductive and for pulses of about one volt becomes fully conductive. The input pulse then passes through diode 14 and capacitor 22 to the base 24 of transistor 26, making it conductive and transmitting the pulse through emitter 27 to ground. When the transistor 26 becomes conductive, load current flows limited by the size of resistor 29 and dropping the potential of junction 38 to a value equal to the collector-emitter drop through transistor 28. This value is applied through resistor 32 and capacitor 36 to the base 34 of transistor 18, and, being negative relative to the bus 31, makes this transistor conductive. The emitter-collector current drawn by this transistor causes a potential drop in resistor 21 and causes its terminal 23 to become positive relative to ground, locking transistor 26 in its fully conductive state. Similarly, current of transistor 26 through resistor 29 locks transistor 18 in its fully conductive state. In this switch-on condition the diode 14 is fully back-biased because its cathode is at the positive potential of bus 31 less the drop through transistor 18 of not over one volt, while the diode anode is at ground potential. However, the diode 13 is only slightly back-biased, for while its anode is at ground potential its cathode is elevated above ground potential by only the potential drop through transistor 26. This drop may be as little as 0.3 volt.

When a second positive pulse is applied to the fully-on switch, it is turned off as follows. The positive pulse is coupled to the diode anodes and passes through the lightly back-biased diode 13 in preference to passing through the heavily back-biased diode 14. The positive pulse passes from diode 13, through capacitor 36, to the base 34 of transistor 18, causing this base to become at least as positive as the emitter 39 and making the transistor nonconductive. This removes current from the resistors 19 and 21, reducing the potential of junction 23 and of base 24 of transistor 26 to zero and thus making transistor 26 nonconductive. This removes current from the load resistor 29. It also restores the potential of junction 38 to that of the positive bus, thus locking the transistor 18 in the nonconductive condition. The lack of emitter-collector current in transistor 18 also locks transistor 26 in the nonconductive condition. Thus the circuit has been returned to the no-load current condition, ready for the described cycle of operation to be repeated.

This circuit may be operated on negative pulses by transposing the transistors so that transistor 26 is of the PNP type and transistor 18 is of the NPN type. Additionally, the diodes 13 and 14 must be reversed and the bus 31 energized from a negative source.

It is desirable, that the transistors employed in this circuit be of the silicon type, particularly transistor 26, so that the currents drawn by the transistors in the no-load circuit condition are minimum.

The following list is furnished as an illustration of component and magnitude sizes.

| | | |
|---|---|---|
| Capacitor **12** | mfd | 10 |
| Capacitor **22** | mfd | 4.7 |
| Capacitor **36** | mfd | 4.7 |
| Resistor **16** | K | 100 |
| Resistor **19** | K | 33 |
| Resistor **21** | K | 100 |
| Resistor **33** | K | 100 |
| Resistor **32** | K | 100 |
| Resistor **29** | K between | 1.5–7 |
| Diode **13** | | 1N684 |
| Diode **14** | | 1N684 |
| Transistor **18** | | 2N718 |
| Transistor **26** | | 2N1132 |
| +B potential | v | 2.6 |

The input pulse can be between +1 volt and 2.6 volts.

Figure 2:
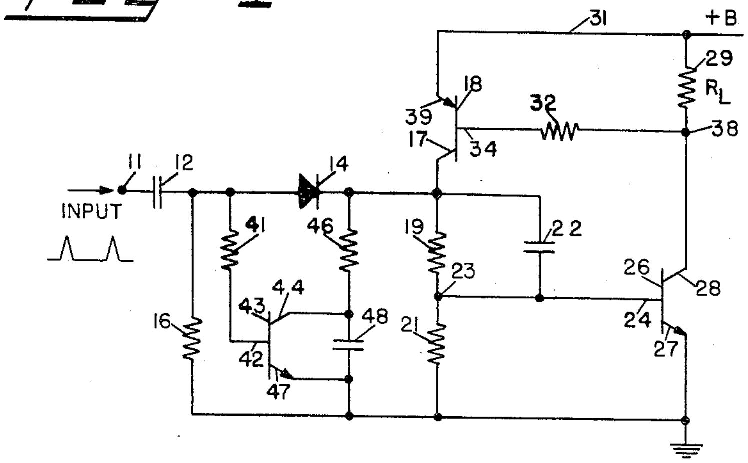
FIGURE 2 is another embodiment of the invention employing three transistors and one diode.

A second preferred circuit is shown in FIGURE 2. It differs from the circuit of FIGURE 1 in employing a third transistor to reverse the polarity of the input pulse in turning off the switch current. The input terminal 11 is A.C. coupled not only to the anode of single diode 14 and through resistor 16 to ground but also through a resistor 41 to the base 42 of a NPN transistor 43. The collector 44 is connected through a resistor 46 to the cathode of diode 14 and the emitter 47 is grounded. The collector and emitter are coupled together by a large capacitor 48. The base 34 of PNP transistor 18 is connected through resistor 32 to junction 38. The load resistor 29 is connected between the positive bus 31 and the collector 28 of NPN transistor 26. The by-passed resistor 19 and resistor 21 are connected between the collector 17 of transistor 18 and ground, with the junction 23 connected to the base 24 of transistor 26. Emitter 39 is connected to the positive bus and emitter 27 is grounded.

In the operation of the circuit of FIGURE 2, the resistor 29 represents the resistance of the useful load through which current is to be switched on and off. In the current-off condition the three transistors 18, 26 and 43 are nonconductive and the diode 14 has ground potential applied to both sides. Upon application of a positive pulse at the input terminal 11, the pulse passes through capacitor 12, diode 14 and capacitor 22 to the base 24 of transistor 26, turning it on. This switches the load current on. The potential drop through the load resistance 29 applies a low potential to junction 38 and base 34 of transistor 18, making it conductive. This draws current through resistors 19 and 21, and applies a back bias to diode 14. It also applies a positive collector bias to the transistor 43. The base 42, however, is at ground potential after passage of the input pulse so that the transistor 43 is nonconductive. The capacitor 48 introduces a time lag so that, in the event that positive bias is applied to collector 44 before the termination of the input pulse, the potential of the collector 44 is prevented from rising.

When a second positive pulse is applied to the input terminal 11, it makes the base 42 of transistor 43 positive and appears at the collector 44 with reversed polarity as a negative pulse. This negative pulse passes through resistor 46 and capacitor 22 to the base 24 of transistor 26, making it nonconductive. This terminates the flow of useful load current and raises the potential of junction 38 to that of the postive bus 31. This in turn makes transistor 18 nonconductive, which restores ground potential to the base 24 of transistor 26, locking it open. It also removes bias from the collector 44 of transistor 43, restoring its nonconductivity, and removes the back bias from the diode 14. The circuit is now in condition for another cycle of operations.

This circuit may be modified for use with negative input pulses as described in connection with FIGURE 1. Again it is highly desirable to employ silicon transistors in order to reduce the current drain of the switch in its no-load state.

What is claimed is:

An electronic switch comprising, a first transistor of the NPN type, a second transistor of the PNP type, each said transistor having at least a base, emitter and collector, a grounded source of positive potential, a useful resistive load connected between said source and the collector of said first transistor, a load resistor having one end connected to ground and the other end connected through a by-passed resistor to the collector of said second transistor, the emitter of said first transistor being grounded and emitter of said second transistor being connected to said source, a circuit connecting the junction of said load resistor and said by-passed resistor to the base of said first transistor, a second by-passed resistor having one end connected to the base of said second transistor, a resistor interconnecting the other end of said second by-passed resistor and the collector of said first transistor, an input terminal, a coupling capacitor having one terminal connected thereto and the other terminal connected to a grounded resistor, a pair of diodes, a connection from the other terminal of said coupling capacitor to the anodes of said pair of diodes, a connection from the cathode of one of said pair of diodes to the collector of said second transistor and a connection from the cathode of the other of said pair of diodes to the other end of said second by-passed resistor, whereby successive positive pulses applied to said input terminal alternately cause energization and deenergization of said useful resistive load.

References Cited by the Examiner

UNITED STATES PATENTS

| | | | |
|---|---|---|---|
| 2,764,343 | 9/1956 | Diener | 328—195 |
| 2,831,113 | 4/1958 | Weller | 307—88.5 |
| 2,974,234 | 3/1961 | Lohman | 307—88.5 |
| 2,986,650 | 5/1961 | Walfendale | 307—88.5 |
| 3,028,507 | 4/1962 | Sacks | 307—88.5 |
| 3,041,471 | 6/1962 | Feissel | 307—88.5 |
| 3,121,802 | 2/1964 | Palmer | 307—88.5 |

OTHER REFERENCES

Army Technical Manual TM 11–690, March 1959, pp. 205–207.

ARTHUR GAUSS, *Primary Examiner.*